(12) United States Patent
Tignon et al.

(10) Patent No.: US 7,751,117 B2
(45) Date of Patent: Jul. 6, 2010

(54) OPTICAL PARAMETRIC MICRO-OSCILLATOR COMPRISING COUPLET CAVITIES

(75) Inventors: Jerome Tignon, Paris (FR); Cristiano Ciuti, Sceaux (FR); Gregor Dasbach, Reutlingen (DE); Carole Diederichs, Paris (FR)

(73) Assignees: Centre National de la Recherche Scientifique (corp.), Paris (FR); Universite Paris 7-Denis Diderot (university), Paris (FR)

( * ) Notice: Subject to any disclaimer, the term of this patent is extended or adjusted under 35 U.S.C. 154(b) by 16 days.

(21) Appl. No.: 11/916,644

(22) PCT Filed: Jun. 6, 2006

(86) PCT No.: PCT/FR2006/001280

§ 371 (c)(1), (2), (4) Date: May 16, 2008

(87) PCT Pub. No.: WO2006/131640

PCT Pub. Date: Dec. 14, 2006

(65) Prior Publication Data

US 2009/0097510 A1   Apr. 16, 2009

(30) Foreign Application Priority Data

Jun. 6, 2005   (FR) .................................. 05 05708

(51) Int. Cl.
*G02F 2/02* (2006.01)
*G02F 1/35* (2006.01)
*H01S 3/082* (2006.01)
*H01S 3/10* (2006.01)
*H01S 3/091* (2006.01)

(52) U.S. Cl. ........................... 359/330; 372/22; 372/97; 372/105

(58) Field of Classification Search ......... 359/326–332; 372/21, 22, 92, 97, 98, 99, 105; 385/122
See application file for complete search history.

(56) References Cited

U.S. PATENT DOCUMENTS 5,402,437 A * 3/1995 Mooradian .................. 372/92

(Continued)

FOREIGN PATENT DOCUMENTS

FR   2 751 796 A1   1/1998

OTHER PUBLICATIONS

EPO International Search Report re PCT/FR2006/001280, completed Sep. 27, 2006, mailed Oct. 10, 2006.

(Continued)

*Primary Examiner*—Daniel Petkovsek
(74) *Attorney, Agent, or Firm*—Duane Morris LLP

(57) ABSTRACT

The invention relates to the field of optical parametric oscillators (OPO), especially to an essentially vertical monolithic system (S) for parametric conversion from a pump wave with a pump wavelength, said system comprising at least two resonant cavities (6, 7). Said cavities are coupled by at least one coupling mirror (3), at least one of the cavities comprising an active non-linear medium, and the at least one coupling mirror being arranged in such a way that the parametric frequencies associated with the pump wavelength are located in the stop line of the at least one mirror for an injection direction of the pump wave essentially according to the axis of the system.

16 Claims, 9 Drawing Sheets

U.S. PATENT DOCUMENTS

| | | | | |
|---|---|---|---|---|
| 5,854,802 | A | * | 12/1998 | Jin et al. ..................... 372/22 |
| 6,356,370 | B1 | * | 3/2002 | Damen et al. ................. 398/92 |
| 2005/0271092 | A1 | * | 12/2005 | Ledentsov et al. ............ 372/20 |
| 2006/0092500 | A1 | * | 5/2006 | Melloni et al. .............. 359/330 |

OTHER PUBLICATIONS

J. Teja, et al., "Twin-Beam Generation in a Triply Resonant Dual-Cavity Optical Parametric Oscillator," Feb. 2, 1998, vol. 2, No. 3, pp. 65-69; Optics Express.

J.J. Baumberg, et al., "Parametric Oscillation in a Vertical Microcavity: A Polariton Condensate of Micro-Optical Parametric Oscillation", Dec. 15, 2000, vol. 62, No. 24, (whole document); Physical Review B—The American Physical Society.

C. Weisbuch, et al., "Observation of the Coupled Exciton-Photon ode Splitting in a Semiconductor Quantum Microcavity," Dec. 7, 1992, vol. 69, No. 23, pp. 3314-3317; Physical Review Letters, The American Physical Society.

P. Pellandini, et al., "Dual-Wavelength Emission from a coupled Semiconductor Microcavity", Aug. 18, 1997, vol. 71, No. 7, pp. 864-866; Applied Physics Letters, American Isntitute of Physics.

I. Ribet, et al., "Widely Tunable Singe-Frequency Pulsed Optical Parametric Oscillator," Feb. 15, 2002, vol. 27, No. 4, pp. 255-257; Optics Letters, Optical Society of America.

* cited by examiner

EXAMPLE OF SOLUTION ACCORDING TO PRIOR ART

Figure 3A
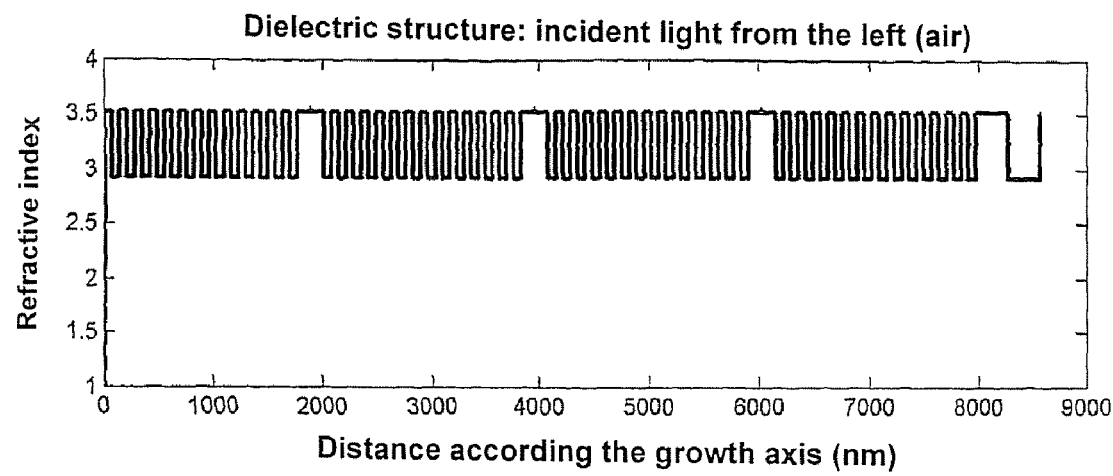
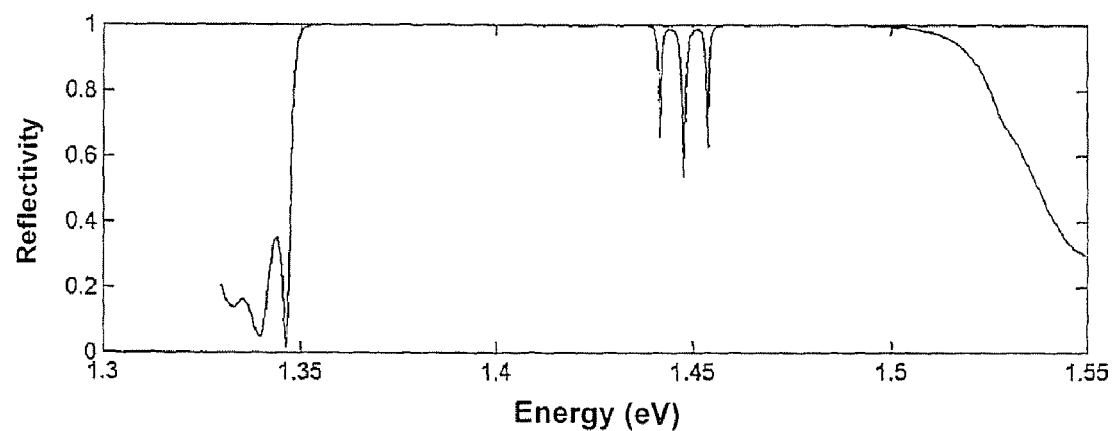
Figure 3B

OPTICAL PARAMETRIC MICRO-OSCILLATOR COMPRISING COUPLET CAVITIES

CROSS-REFERENCE TO RELATED APPLICATIONS

This application is a 371 National Stage of International Application No. PCT/FR2006/001280, filed Jun. 6, 2006, which claims the benefit of European Application No. 05/05708, filed Jun. 6, 2005. The aforementioned patent applications are expressly incorporated herein by reference in their entireties.

FIELD OF THE INVENTION

The present invention relates to the field of optical parametric conversion systems, optical parametric oscillators (OPO), optical parametric amplifiers (OPA), as well as the field of the generation of twin photons.

BACKGROUND

The optical parametric conversion obtained in a non-linear optical medium enables for example "pump" photons, injected into the system at a frequency $\omega_p$, to be converted into pairs of "signal" and "idler" photons at the different frequencies $\omega_s$ and $\omega_i$. It enables twin photons to be generated, new frequencies to be generated (for the OPO) or weak signals to be amplified (for the OPA). Said effect is amplified when the non-linear medium is placed within a resonant cavity so as to produce an oscillator. It is known that when the cavity is close to the resonance for the "signal" and "idler" (doubly resonant OPO, or DROPO) or for the three waves (triply resonant OPO, or TROPO), the threshold for the parametric generation may be significantly reduced, which significantly increases the efficiency of the mechanism. It will be noted that one such system may generally operate under impulsional excitation. The OPO are sources of coherent light wherein the generation of new frequencies is spontaneous above a power threshold of the "pump". The OPA, wherein the generation is not spontaneous, are used for the capacity thereof for amplifying the light beams, of low intensity, at the $\omega_s$ or $\omega_i$ frequency. The nature of the non-linear medium as well as the drawing of the cavities determines the $\omega_s$ and $\omega_i$ frequencies. For an active medium having an $\chi^{(2)}$ type non-linear susceptibility, the conservation of energy results in the $2\omega_p=\omega_s+\omega_i$ relation. For an $\chi^{(3)}$ type medium, the relation is $2\omega_p=\omega_s+\omega_i$. In both cases, an effective parametric conversion requires optimisation of the phase agreement condition which is written as follows:

$\Delta k=k_p-k_i-k_s=0$ for an $\chi^{(2)}$ type system or $\Delta k=2k_p-k_i-k_s=0$ for an $\chi^{(3)}$ type system.

Prior art knows monolithic or non-monolithic parametric conversion systems with the aid of cavities for obtaining a multi-resonance. The problem with the conventional non-monolithic OPO is the bulkiness thereof and complexity thereof because they require a pump laser, a non-linear crystal and external mirrors for the cavities. The difficulty for obtaining an effective parametric conversion is linked to the need to satisfy that which is known by the person skilled in the art as the phase agreement condition on one hand and on the other hand the necessity for obtaining resonant cavity modes with the parametric frequencies. Concerning the monolithic systems, two very different situations are differentiated depending on whether the non-linearity is in $\chi^{(2)}$ or $\chi^{(3)}$.

The publication by Savvidis, Baumberg, Stevenson, Skolnick, Whittaker and Roberts "Angle-Resonant Stimulated Polariton Amplifier", published in Physical Review Letters, Vol 84, page 1547, February 2000, discloses a system for the parametric amplification via the means of a single planar microcavity. The electromagnetic field is entirely confined by the cavity according to the direction of growth and is moreover in strong exciton-photon coupling regime with the quantum well system placed in the core thereof. In said system, the $\chi^{(3)}$ susceptibility is very high and enables an effective parametric conversion to be obtained for the $\omega_p$, $\omega_s$ and $\omega_i$ close frequencies, all included the stop band of the Bragg mirrors. The single cavity, in strong exciton-photon coupling regime, here enables a triple resonance to be obtained for the three frequencies. Nevertheless, the compliance of the phase agreement conditions requires that the injection of pump photons is carried out at a high value (typically)16° and delicate to determine particular angle, which makes any practical use difficult. In addition, the idler photons are emitted at an even higher angle, an angle for which the coupling of photons with the outside of the cavity is particularly low, which makes the generation of twin photons difficult. Finally, the strong exciton-photon coupling regime being essential for obtaining the phase agreement, the system only operates, with the materials available for the manufacturing, such as GaAs, at a low temperature.

On the other hand, for the systems using a non-linearity in $\chi^{(2)}$, the publication by Haidar, Forget and Rosencher, "Optical Parametric Oscillation in Microcavities Based on Isotropic Semiconductors: a Theoretical Study", published in IEEE Journal of Quantum Electronics, Vol 30, No 4, April 2003, discloses a system for the parametric oscillation wherein the reflectivity diagram of the mirrors used is such as illustrated in FIG. 1. Said document discloses a device wherein the $\omega_p$, $w_s$ and $w_i$ frequencies are very different and may not all be included in the stop band of a single Bragg mirror. The resonance condition is therefore sought for the signal and the idler with the aid of two cavities not strongly coupled to one another in the direction defined further.

Patent application FR 2 751 796 is also known, in the name of the CEA, which describes a system of two coupled lasers wherein a first laser pumps a second laser. The laser cavities of said document are however not arranged for generating parametric frequencies. Indeed, the system described in D1 is not a parametric oscillator, but a simple laser. In particular, said document does not describe the nature of the coupling between the laser cavities and does not enable parametric frequencies to be managed.

SUMMARY

One aim of the present invention is to provide an alternative solution to the existing parametric conversion systems in order to easily produce the parametric conversion.

Another aim of the present invention is to enable the parametric conversion for close frequencies, in the direction defined further, between the pump, the signal and the idler or at least for close frequencies between two of the three parametric frequencies.

Another aim of the present invention is to produce a vertical parametric conversion system for an injection angle of the pump according to the axis of the system.

In order to solve at least one of said problems, the present invention relates to a monolithic system, for the parametric conversion from a pump wave to a pump frequency, comprising at least two resonant cavities, said cavities being strongly coupled via at least one coupling mirror, said cavities being arranged for generating parametric frequencies associated to said pump frequencies, at least one of said cavities comprising an active non-linear medium, said at least one coupling mirror being arranged such that said parametric frequencies are located in the stop band of said at least one mirror for an injection direction of said pump wave via the surface of said system.

For the purposes of the present application, and as will be understood by the person skilled in the art, the term "cavities strongly coupled to one another" corresponds to the degeneracy lift of the resonant cavity modes.

It is also noted that the direction of the injection of the pump wave is produced "via the surface" of the system. Indeed, the system according to the invention comprises a plurality of layers according to substantially parallel planes and forming a monolithic system. The injection is therefore produced according to said planes and not via the wafer of said layers as in known systems. The system according to the invention is therefore known by the person skilled in the art as being a system with vertical injection, as opposed with an injection via the wafer. Likewise, the system according to the invention is a surface emission system.

In this way, the specific modes of the coupled system produce an assembly of multi-resonant optical modes for the parametric frequencies.

According to a first embodiment, the non-linear material has an .chi..sup.(3) type susceptibility enabling signal and idler photons to be generated at close frequencies of the pump.

According to a second embodiment, the material has an $\chi^{(2)}$ type susceptibility enabling a conversion wherein two of the three parametric frequencies will be close to one another.

For the purposes of the present application, the term "close frequencies" corresponds to the frequencies included in the stop band of the Bragg mirror.

According to a first mode of implementation, in order to obtain a triply resonant device, the abovementioned system may comprise three resonant cavities, said cavities being strongly coupled via two coupling mirrors, said cavities being arranged for generating three parametric frequencies associated to said pump frequency, said system comprising two mirrors which close the system and which form said cavities with said two coupling mirrors.

According to a second mode of implementation, in order to obtain a doubly resonant device, said system may comprise two resonant cavities, said cavities being strongly coupled via a coupling mirror, said cavities being arranged for generating three parametric frequencies associated to said pump frequencies, said system comprising two mirrors which close the system and which form said cavities with said coupling mirror.

The active non-linear medium may be either a quantum well, or a quantum dot system, or even a solid material, for example a semiconductor or a polymer, or any other solid active medium.

The coupling mirrors used are preferably Bragg mirrors, or even a dielectric or metallic layer having the reflectivity parameters suitable for the present invention.

According to one possible embodiment, said at least one cavity has a thickness substantially equal to a small integral number of times the semi-wavelength of the pump wave desired to be converted, and this, so that the field is sufficiently intense in the cavity.

Advantageously, the parametric conversion system according to the present invention enables the phase agreement condition to be obtained for the case of a weak light-matter coupling regime and also for the case of a strong light-matter coupling regime (photon-exciton).

If the growth method is not accurate enough for targeting the nominal thicknesses and in order to finely adjust the resonance condition between the cavity modes and the parametric frequencies, the thickness of at least one cavity optionally has a lateral gradient, i.e. in the normal plane of the direction of the growth axis for a vertical system.

Preferably, if the growth method is not accurate enough for targeting the nominal thicknesses and in order to finely adjust the resonance condition between the cavity modes and the parametric frequencies, the thickness of one of the cavities has a lateral gradient in a first direction, and a second cavity has a lateral gradient in a second direction different to said first direction, for example perpendicular, in the normal plane to the direction of the growth axis.

Moreover, in order to obtain a more isotropic light mode, and as opposed to the devices giving an emission via the wafer of the structure, the system according to the invention is a surface emission system. The latter also has the advantage of being able to test the components before cutting and optionally being able to parallelise the manufacture or use of a large number of components of the same nature. Said type of geometry also enables easy coupling with optical fibres.

According to an advantageous growth technique in the field of microstructures, the core of the cavities and/or certain Bragg mirrors are epitaxied.

The invention also relates to an optical device intended for producing parametric conversion comprising a system such as above-described, the device further comprising a means for injecting a pump wave to a pump wavelength, said injection means being suitable for injecting said pump wave substantially according to the axis of said system.

Advantageously, according to one embodiment and in order to obtain a compact device said injection means is formed by a cavity known as injection, rigidly connected to said system and weakly coupled to same via a weak coupling mirror for said pump wavelength.

Advantageously, the cavity known as injection may be outside of the system such as above-described and may be attached after the growth of the system via the technique known under the name of "wafer bonding".

Advantageously, the cavity known as injection may be manufactured according to prior art for the manufacturing of VCSEL so as to authorise an electrical injection of same.

Advantageously and according to another embodiment of a compact system, the injection cavity may be one of the cavities used for producing the parametric conversion system.

BRIEF DESCRIPTION OF THE DRAWINGS

The invention will be better understood from the following description, provided merely for purposes of explanation, of one embodiment of the invention, in reference to the appended figures:

FIG. 3A illustrates the dielectric structure according to the invention the embodiment shown in FIG. 2;

FIG. 3B illustrates the reflectivity diagram of the dielectric structure of FIG. 3A;

DETAILED DESCRIPTION

Figure 1:
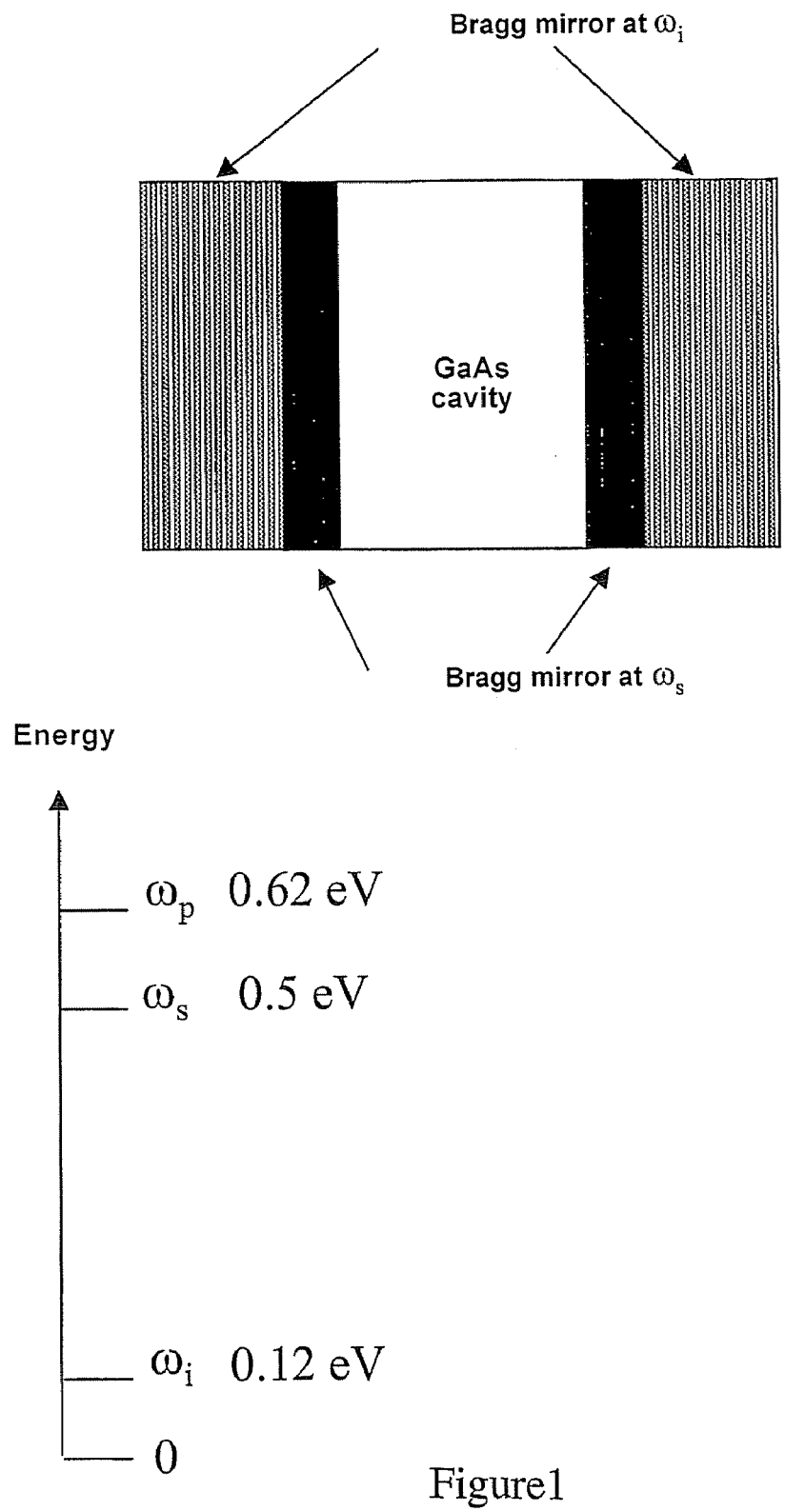
FIG. 1 illustrates the schematic diagram of a parametric conversion system according to prior art and the diagram of parametric frequencies according to prior art.
Figure 2:
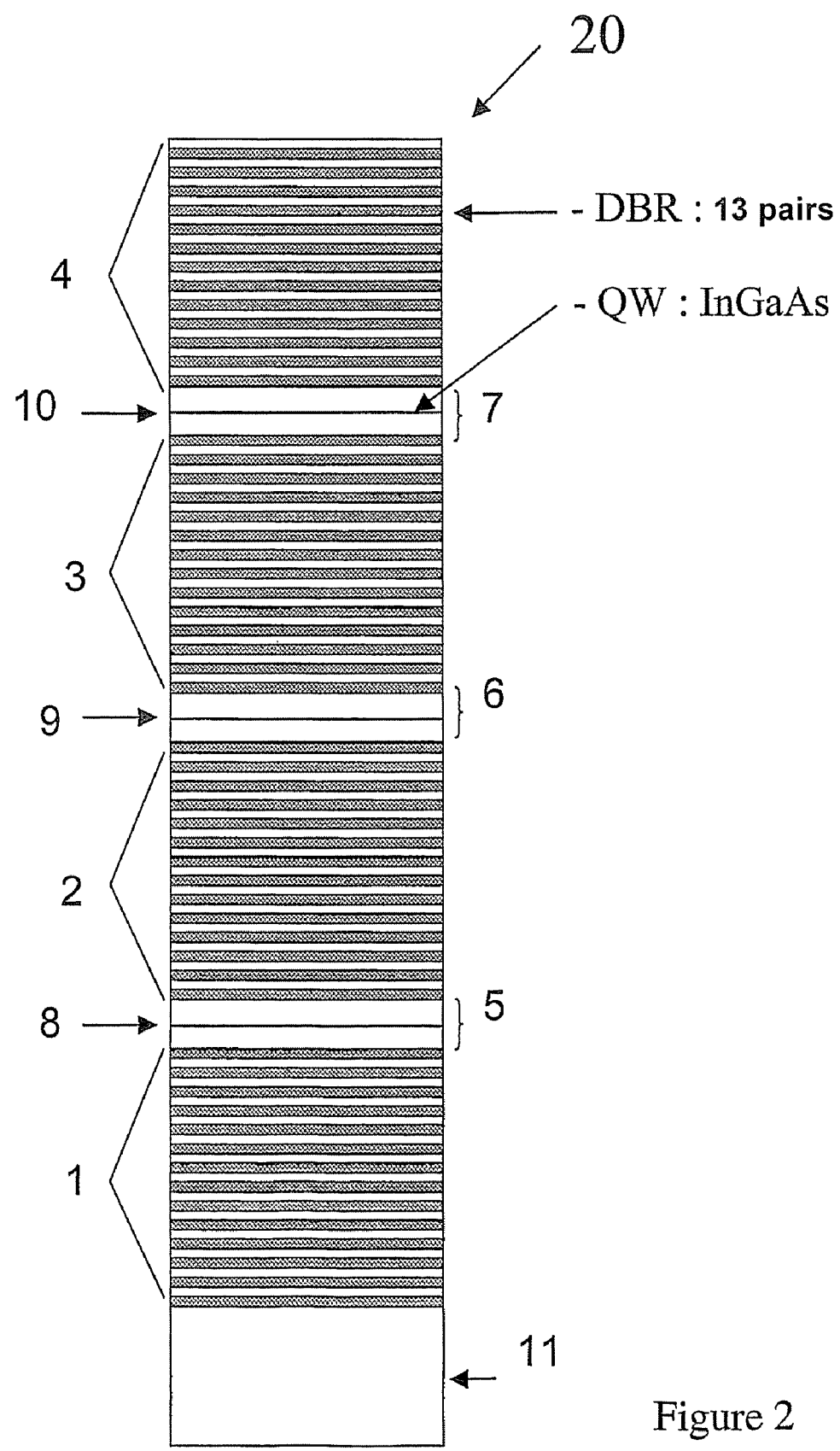
FIG. 2 illustrates one embodiment of the parametric conversion system according to the invention.

According to one embodiment illustrated in FIG. 2, the invention relates to a parametric conversion system 20 for converting a pump frequency, into a signal frequency and an idler frequency. Said system consists of a structure comprising for example three Fabry-Perot resonant cavities 5, 6 and 7 in GaAs. It also comprises a substrate 11. It is advantageous to use thin cavities, for example a low multiple of the semi-wavelength so as to obtain a strong amplitude of the electrical field at the antinode of the field where the active material will be placed (microcavity).

According to the example presented, each cavity has a thickness equal to once the wavelength. Each of the cavities is gripped by two Bragg reflection mirrors 1 and 2 for cavity 5; 2 and 3 for cavity 6, and 3 and 4 for cavity 7. The mirrors consist of a repeated stacking of two transparent layers, with different indexes and with a thickness enabling the desired reflectivity to be obtained for operating the device. The thickness is therefore for example equal to the quarter of the pump wavelength for each of the layers. More specifically, in the example illustrated in FIG. 2 or FIG. 3A, each of the Bragg mirrors comprise 13 pairs of AlAs layers alternating with the GaAs layers. The reflectivity of the Bragg mirrors 1, 2 and 3, illustrated in FIG. 3B is slightly less than the unit such that the cavities are coupled to one another.

More specifically, cavities 5 and 6 are strongly coupled via the Bragg mirror 2 and cavities 6 and 7 are strongly coupled via the Bragg mirror 3. As the person skilled in the art will understand, for a dual-cavity system, the strong coupling is obtained when the reflectivity of the coupling mirror is less than $4R/(1+R)^2$, where R is the reflectivity of the mirrors which grip the assembly of two cavities. In a more general case, it is easy to determine the reflectivity and therefore the number of layers required for obtaining a strong coupling mirror, by carrying out the calculation of the reflectivity via the standard transfer matrices method.

FIG. 3B illustrates the reflectivity diagram of the mirrors according to FIG. 2 for which the three strongly coupled and resonant modes with the parametric frequencies for a material in $\chi^{(3)}$ appear (at 7 meV of interval) at the centre of the stop band of the Bragg mirrors.

The assembly here is coupled on the outside via the Bragg mirrors 1 and 4.

Individually, each of said cavities is presented in the form of structure of known type and the manufacturing of which is controlled by the person skilled in the art for producing vertical-cavity semiconductor lasers, such as for example described in the publications by J. L. Jewell, J. P. Harbison, A. Sherer, Y. H. Lee, L. T. Florez, "Vertical-cavity surface-emitting lasers—design, growth, fabrication, characterization", IEEE J. Quantum Electron. QE-27, p 1332 (1991) and by M. Shimada, T. Asaka, Y. Yamasaki, H. Iwano, M. Ogura, S. Mukai, "Low-threshold surface-emitting lasers-diodes with distributed Bragg reflectors and current blocking layers", Appl. Phys. Lett. 57, p 1289 (1990), or for producing dual-cavity coupled systems, such as described in the publications by P. Michler, M. Hilpert, G. Reiner, "Dynamics of dual-wavelength emission from a coupled semiconductor microcavity laser", Appl. Phys. Lett. 70, p 2073 (1997), and by P. Pellandini, R. P. Stanley, R. Houdre, U. Oesterle, M. Ilegems, C. Weisbuch, "Dual-wavelength emission from a coupled semiconductor microcavity", Appl. Phys. Left. 71, p 864 (1997).

Apart from the inter-cavity coupling, each cavity has a specific Fabry-Perot mode having an energy of the mode noted w(k) which grows rapidly according to the wave vector in the plane of the layers k, or in an equivalent manner according to the angle of incidence, one and the other being linked by a simple trigonometric relation.

When the cavities have the same thickness, the inter-cavity coupling lifts the degeneracy between the three modes, in so far as the coupling between cavities is greater than the spectral width of the modes.

The result is the appearance of 3 new specific modes which correspond to the photonic modes delocalised in the entire structure and no longer localised in each of the cavities.

In said embodiment of the invention, an active non-linear medium formed for example by an assembly of quantum wells 8, 9, 10, is positioned within the cavities, in the vicinity of the maxima of the electrical field.

The fundamental excitonic transition here has an energy close to the resonance with the microcavities. According to one simple variant, a single quantum well of InGaAs (at 6% of In) is placed at the centre of each of the three cavities, being understood that increasing the number of quantum wells enables the non-linearity to be increased.

In this way, a significant contribution is obtained from the non-linearities with each of the specific modes of the system, thus favouring the existence of a low excitation power threshold for the parametric oscillations, via distinction with a non-resonant non-linearity, when the operation is carried out in the transparency area of the non-linear medium.

The system 20 therefore constitutes an assembly of 6 coupled oscillators (3 photonic modes and 3 excitons). According to the excitation power and temperature conditions, the matter-radiation coupling therefore corresponds to either a weak exciton-photon coupling regime, or to a strong exciton-photon coupling regime, when the coupling force predominates over the losses.

In weak coupling regime, the system is characterised here, by the existence in the spectrum of 3 resonances (the 3 photonic modes expanded by the excitonic absorption). Therefore, said three resonances are respectively chosen for the injection in the "pump" state and the emission via the "signals" and "idler" states.

In strong coupling regime, the degeneracy between photons and excitons is lifted and the spectrum therefore has 6 new specific modes, mixed exciton-photon states known as the microcavity polaritons. In this case, the "pump", "signal" and "idler" states will be selected among 3 of the 6 specific modes, according to the most advantageous configuration in terms of gain for the parametric oscillation.

It should be noted that, contrarily to the parametric oscillation obtained for the single cavities, the operation principle is no longer limited by the nature of the matter-radiation coupling (weak or strong), and the parametric oscillation may be reached, irrespective of the type of matter-radiation coupling.

According to a principle already known, the parametric oscillation regime may be obtained on condition of satisfying the conservation of the energy or the impulsion (or of the wave vector) between the photons injected in the "pump" state and the photons emitted in the "signal" and "idler" states, which constitutes the phase agreement condition.

The conservation of the energy is satisfied on condition of selecting 3 equidistant energy states, such as to respect the $2\omega_p=\omega_s+\omega_c$ condition, (for a non-linear process of the $3^{rd}$ order), where $\omega_p$ is the energy of the pump, $\omega_s$ the energy of the signal and $\omega_c$ the energy of the idler ($\omega_s<\omega_p<\omega_c$).

Likewise, the conservation of the impulsion is satisfied on condition of respecting the $2k_p=k_a+k_c$ relation where $k_p$ is the wave vector of the pump, $k_c$ the wave vector of the signal and $k_c$ the wave vector of the idler.

According to one advantageous variant of the invention, a thickness gradient is introduced into one or more cavities such as to be able to obtain the zero angle phase agreement for the "pump", "signal" and "idler" states. The introduction of a gradient may be carried out via selective interruption of the rotation of the wafer during the growth, according to a similar principle to that which is known for the single planar cavities, for example described in the publication by C. Weisbuch, M. Nishioka, A. Ishikawa, and Y. Arakawa, "Observation of the coupled exciton-photon mode splitting in a semiconductor quantum microcavity", Phys. Rev. Lett. 69, p 3314 (1992).

In particular, it is possible to introduce a gradient (approximately 1 meV/mm) in perpendicular directions for two of the three cavities, which enables the energy of the three cavities to be adjusted separately. For this purpose, the rotation of the wafer is interrupted during the growth of the first cavity (first thickness gradient), then interrupted, for the second cavity, according to a direction perpendicular to that chosen for the first cavity (second thickness gradient perpendicular to the first). The rotation is again interrupted for the third cavity according to the same direction as for the first. Thus, by moving to the surface of the sample, the relative discordance between the "pump", "signal" and "idler" states may be adjusted in order to adjust the conservation condition of the energy.

The conservation of the impulsion is therefore obtained naturally for an excitation with a zero angle of incidence, i.e. an injection perpendicular to the surface of the sample when the energies respect the $2\omega_p(k_p=0)=\omega_s(k_s=0)+\omega_c(k_c-0)$ condition.

Figure 4:
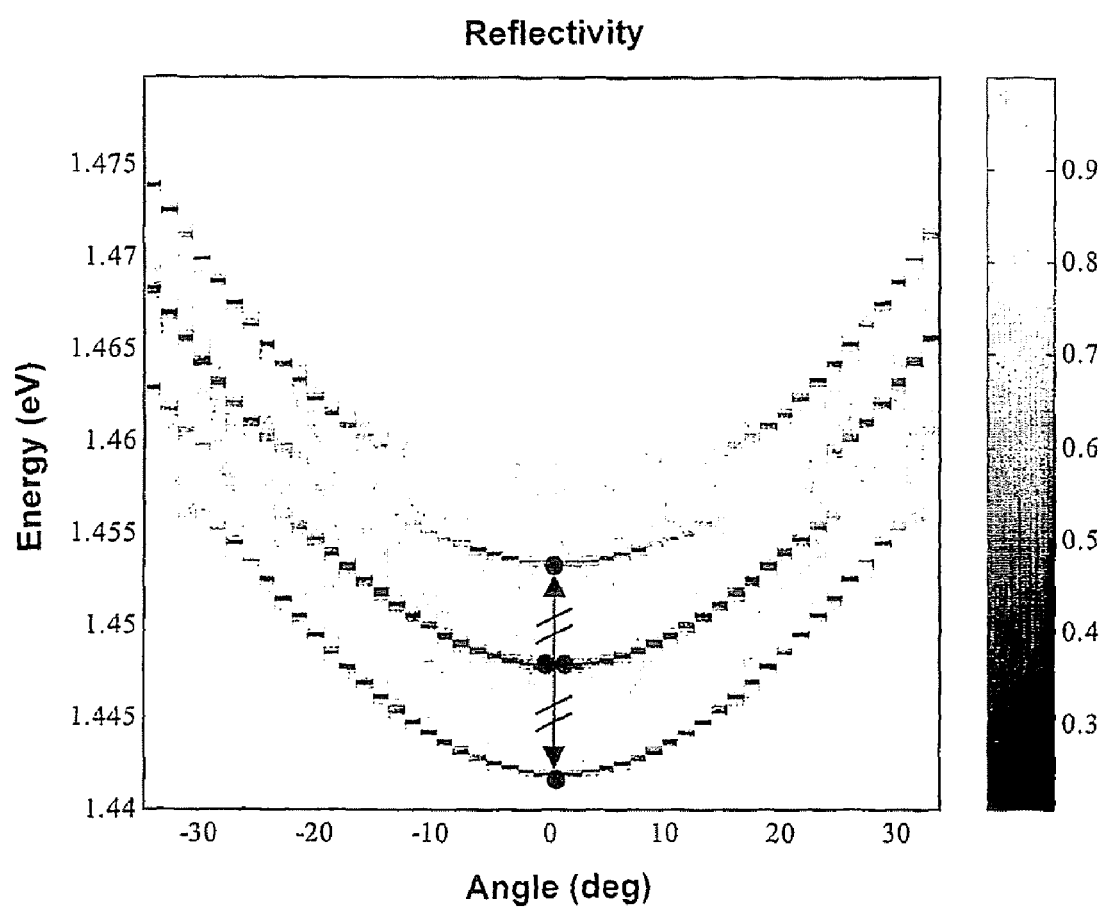
FIG. 4 illustrates a reflectivity diagram calculated by the standard transfer matrices method, wherein the phase agreement is obtained by the system according to the invention, between the three lowest energy states, at the zero angle.

The reflectivity diagram associated with one such configuration is shown schematically in FIG. 4, wherein the dispersion is calculated via the standard transfer matrices method and the excitation is symbolised on the $2^{nd}$, mode where two photons are injected, one photon is emitted by the "signal" and one photon is emitted by the "idler".

It is also possible, by moving on the sample, to obtain a phase agreement for the non-zero angles. The reflectivity diagram associated with one such configuration is presented schematically in FIG. 5.

Said last configuration not producing single "signal" and "idler" modes, it is not favourable for obtaining a parametric oscillation, but nevertheless may enable an emission of intricated modes to be observed on a ring in a plane perpendicular to the growth axis, according to a mechanism similar to the one predicted for photonic wires in a parametric fluorescence type emission.

The above-described effect may be highlighted by an assembly known in the field of emission for semiconductor nanostructures. The device comprises a laser source for the excitation for example the frequency accordable Titan-sapphire type. The excitation is carried out in continuous regime, via the surface of the sample, after focusing on a spot of approximately 20 micrometers in diameter.

For the study of the device, a sample is placed in a Helium cryostat. Positive results have been obtained by the Applicant with the device illustrated in FIG. 2 in a temperature range between 6K and 90K.

However, it is understood that the use of the present invention may be extended to the ambient temperature according to the same principle.

In operatory mode, the substrate has been thinned down via a standard power sanding method, such as to enable optical transmission as well as reflection measurements to be produced. The emission is collected in transmission, with the aid of an optical fibre mounted on a goniometer in order to carry out the angular analysis of the emission. The radiation emitted is detected via a multi-channel photodiode analyzer placed at the output of a spectrometer having a resolution of 100 micro-eV.

Figure 6:
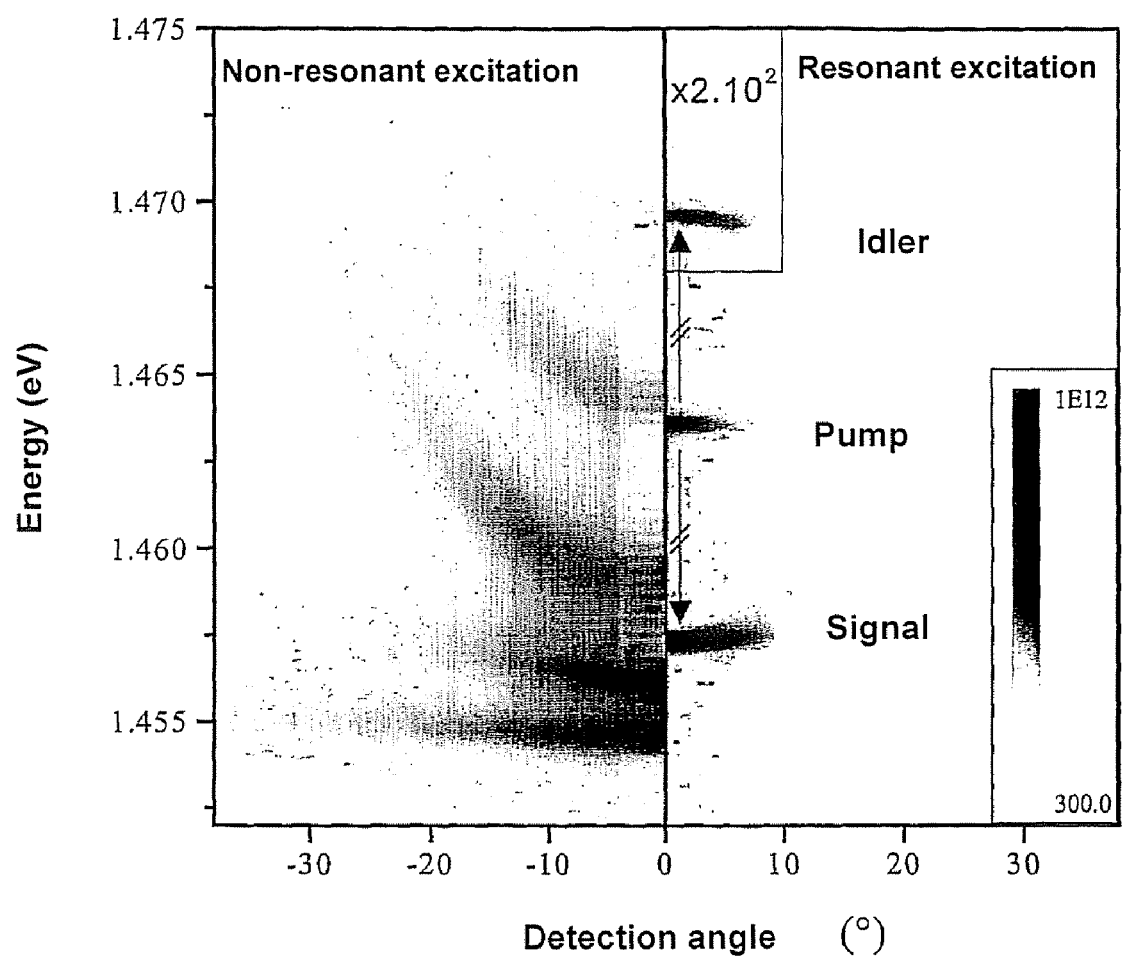
FIG. 6 illustrates, according to the embodiment illustrated in FIG. 2, the measurement of the emission under non-resonant excitation (left-hand graph) as well as the emission measured under resonant excitation of the pump mode (right-hand graph), with the signal/idler pair highlighted.

FIG. 6 shows the emission (photoluminescence) measured according to the detection angle, for a non-resonant excitation (part of the left-hand figure). The emission diagram therefore reflects the dispersion according to the wave vector in the plane of the layers (or in an equivalent manner according to the angle). Up to 5 modes are visible on said figure. A detailed analysis of the experimental results enables the coexistence of 6 modes to be highlighted. The system, in the case of the non-resonant excitation, is in strong coupling regime between excitons and photons. The right-hand part of FIG. 6 shows the measurement of the emission under continuous resonant excitation of one of the 6 modes and under zero angle of incidence ("pump" state) for a position on the sample where the phase agreement is obtained between 3 zero angle states. Beyond a threshold excitation power of 200 mW, the emission of the low energy state (signal) and of the high energy state (idler) grows exponentially.

It is noted that the Applicant was able to experimentally verify that the polarisation of the "signal" and of the "idler" respects the rules of selection imposed by the parametric mechanism (right-hand or left-hand co-circular emission for a right-hand or left-hand co-circular excitation).

It is noted that the Applicant was able to experimentally verify that the device according to the invention also enabled the parametric amplification of a second continuous laser beam, of low intensity, injected in the system at the frequency of the signal to be verified.

Figure 7:
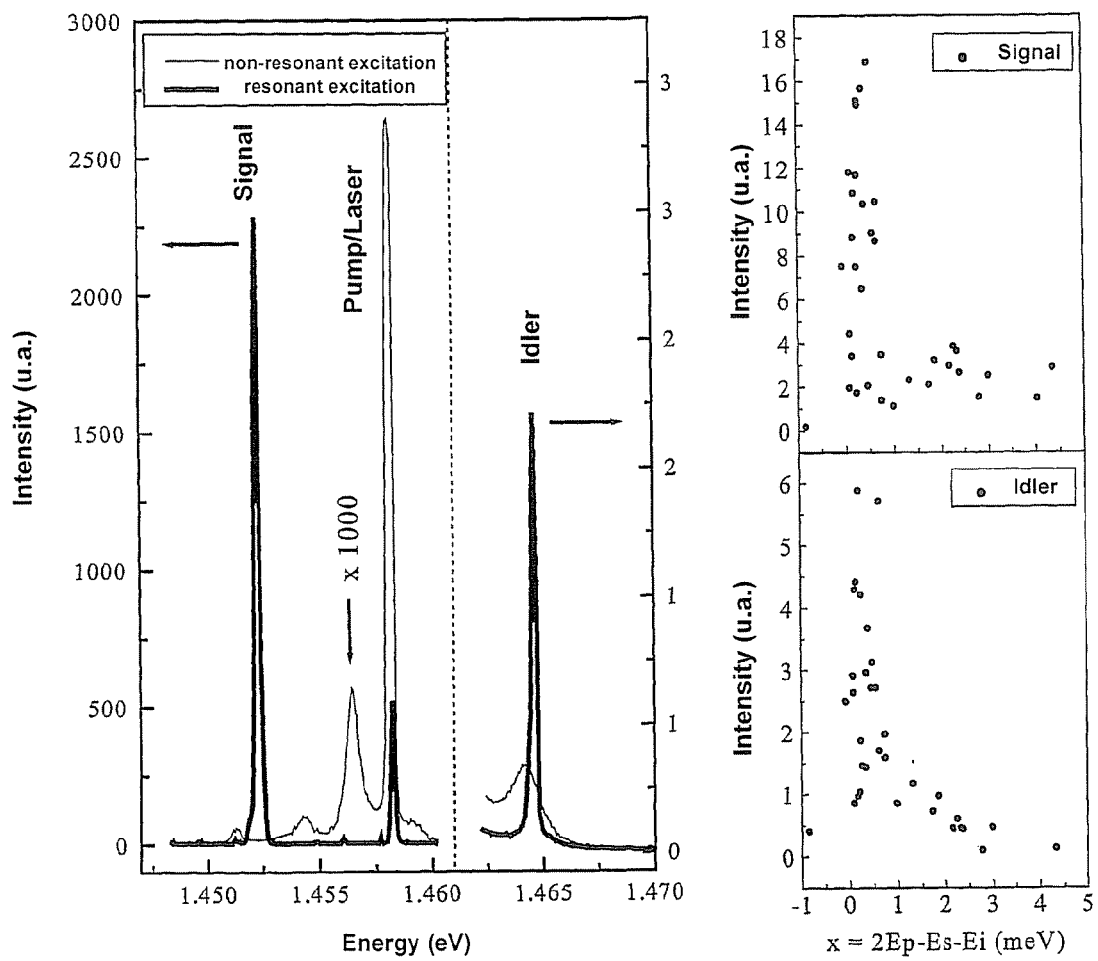
FIG. 7 illustrates the parametric conversion results obtained with the aid of the system according to the invention illustrated in FIG. 2. The left-hand graph shows the spectrum measured (zero angle) under non-resonant excitation and under resonant excitation. The two right-hand graphs show the intensity emitted by the signal or idler according to the "x" phase agreement parameter (taken in the linear regime)

FIG. 7 (left-hand graphs) shows the spectrum of the emission below the threshold (fine black line) and above the threshold (grey line) for the parametric oscillation. In addition to the significant increase of the emission for the "signal" and the "idler" beyond the threshold, the sharpening of the transitions is clearly observed (the "signal" sharpens from 0.7 meV to at least 0.2 meV and the "idler" from 1.5 meV to at least 0.2 meV, close to the resolution limit of the measurement). Likewise, beyond the threshold a slight offsetting towards the high energies characteristic of the parametric oscillation regime is observed.

Figure 5:
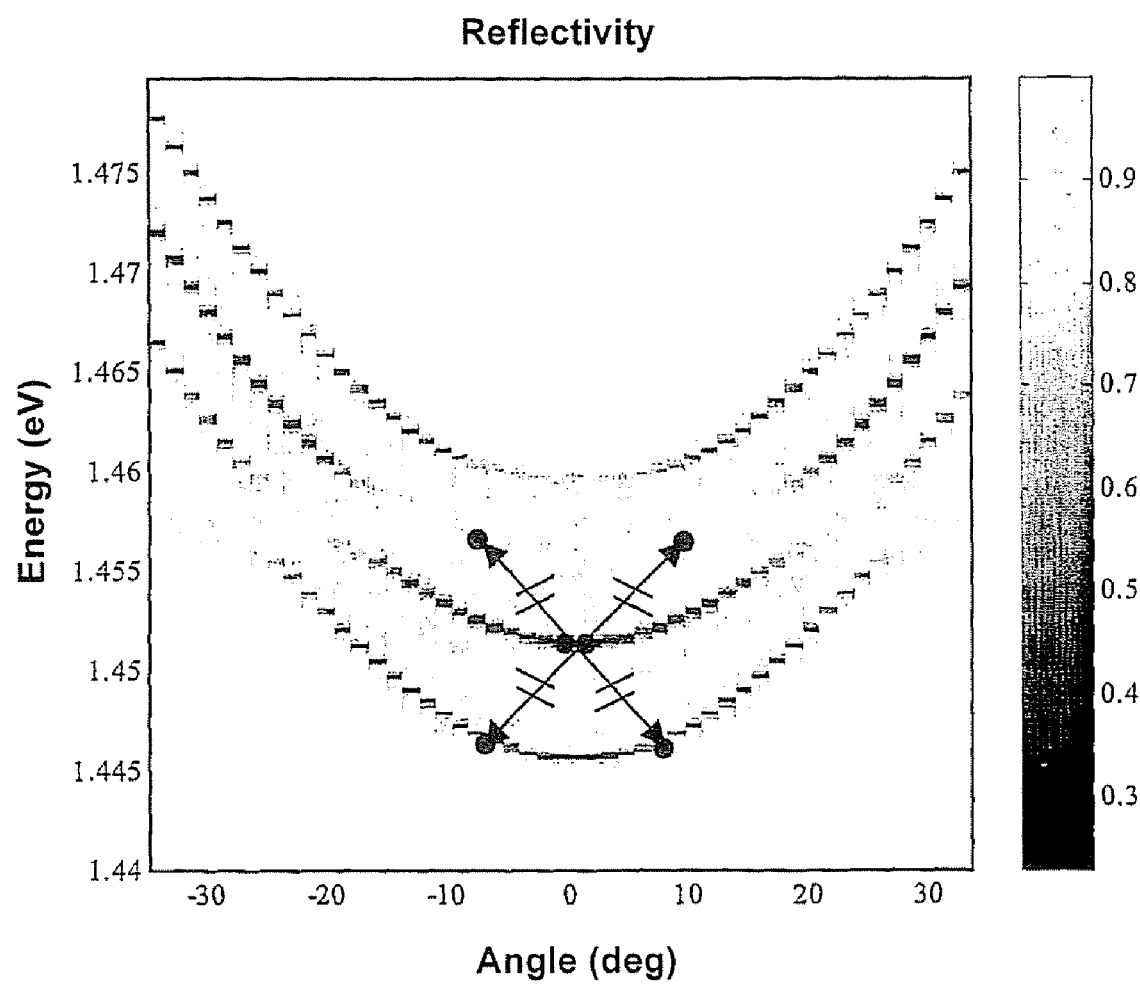
FIG. 5 illustrates a phase agreement obtained by the system according to the invention for a non-zero emission angle and enabling a quantum entanglement to be produced.

It will be noted that apart from the diffusion mechanism shown in FIG. 5, which enables two photons injected on the second branch to be converted into photons on the first low energy branch, and on the third high energy branch, another parametric diffusion mechanism, not shown, still exists. Said other mechanism corresponds to the possibility for the photons injected on the second branch, to be diffused at constant energy, on the first branch, the same low energy branch for the two photons diffused. The two photons are therefore diffused respectively in −k and in +k. In relation to the situation shown in FIG. 5, said mechanism may be shown as a borderline case wherein all of the photons diffused conserve the initial energy. Said mechanism is the only one possible if the phase agreement, therefore the position on the sample, does not enable the parametric diffusion shown in FIG. 4, or the parametric diffusion shown in FIG. 5 to be obtained. Furthermore, said mechanism only intrinsically requires two branches and may therefore be obtained in a dual-cavity system only. It will be noted that said mechanism, if it offers no importance for the generation of new frequencies, has a significant importance for the generation of twin photons in view of producing a source for quantum optics and cryptographic systems. Indeed, in this case, the two photons emitted are intrinsically coupled to the outside in the same manner and will therefore offer the same emission intensity. On the other hand, the emission being carried out at high angles, it will be easy to separate the twin photons emitted.

Moreover, a technical choice is described here, where the number of layers in the Bragg mirrors (13 pairs) and the number of quantum wells (1 well per cavity) was minimised in order to reduce the growth time and minimise a possible inhomogeneity (for example on the width of the quantum wells and therefore on the energy of the wells with respect to each other).

The number of pairs of layers in the Bragg mirrors has an influence on two parameters in the present invention: the finesse of the photonic modes and the importance of the coupling between the cavities. It is known according to the state-of-the-art on the single planar cavities that the threshold for the parametric oscillation is all the more lower as the finesse is large. Inversely, it is important here to obtain a good coupling between the three cavities and therefore to reduce the number of layers for the intermediate mirrors 2 and 3.

It may also be envisaged to optimise the structure by developing a structure having a larger number of pairs for the outer mirrors 1 and 4, in order to increase the overall finesse, while minimising the number of pairs in the coupling mirrors 2 and 3.

Figure 8:
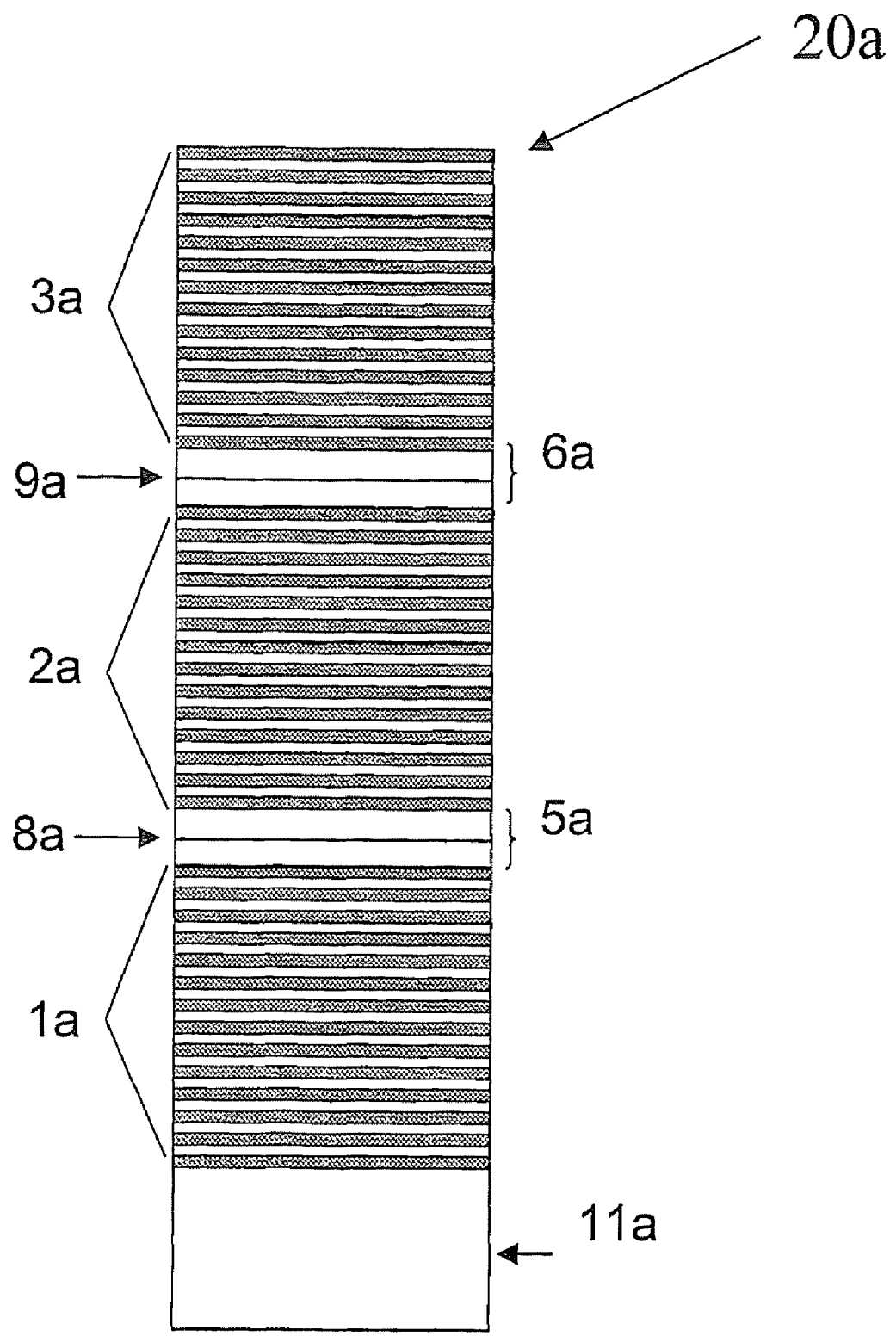
FIG. 8 illustrates a second embodiment of the parametric conversion system according to the invention.

According to a second embodiment, a system 20a comprising only two coupled cavities is produced, as illustrated in FIG. 8. It therefore comprises two cavities 6a, 5a, a coupling mirror 2a and two mirrors 3a and 1a which close the system and which form the cavities 6a, 5a with the coupling mirror 2a. Each cavity contains for example, as previously, an $In_{0.06}Ga_{0.94}As$ 8a and 9a type quantum well. The substrate is noted 11a. Said embodiment is just as suitable for the use of a medium in $\chi^{(3)}$ as for a medium in $\chi^{(2)}$, the two cavities therefore being used to obtain a resonance for the signal and the idler only. In this last case, the thickness of the layers is chosen such that the energy of the coupled cavities is in the transparency area of the material forming the cavity (for example GaAs). For a non-linearity in $\chi^{(2)}$, the pumping is carried out with an energy greater than the signal and than the idler.

The invention also relates to a parametric conversion device comprising a system such as described in the preceding embodiments as well as an injection means for the pump at the frequency of the pump.

According to a first variant, the injection means is for example of laser type and is arranged so that the injection angle, in the system according to the invention, is substantially zero. In accordance with the invention, a parametric conversion and the generation of a signal and idler photon is produced.

According to a second variant, the injection means is built into the system according to the invention and is presented in the form of an additional cavity weakly coupled for the pump wavelength, via a weak coupling mirror having for example a greater reflectivity.

Figure 9:
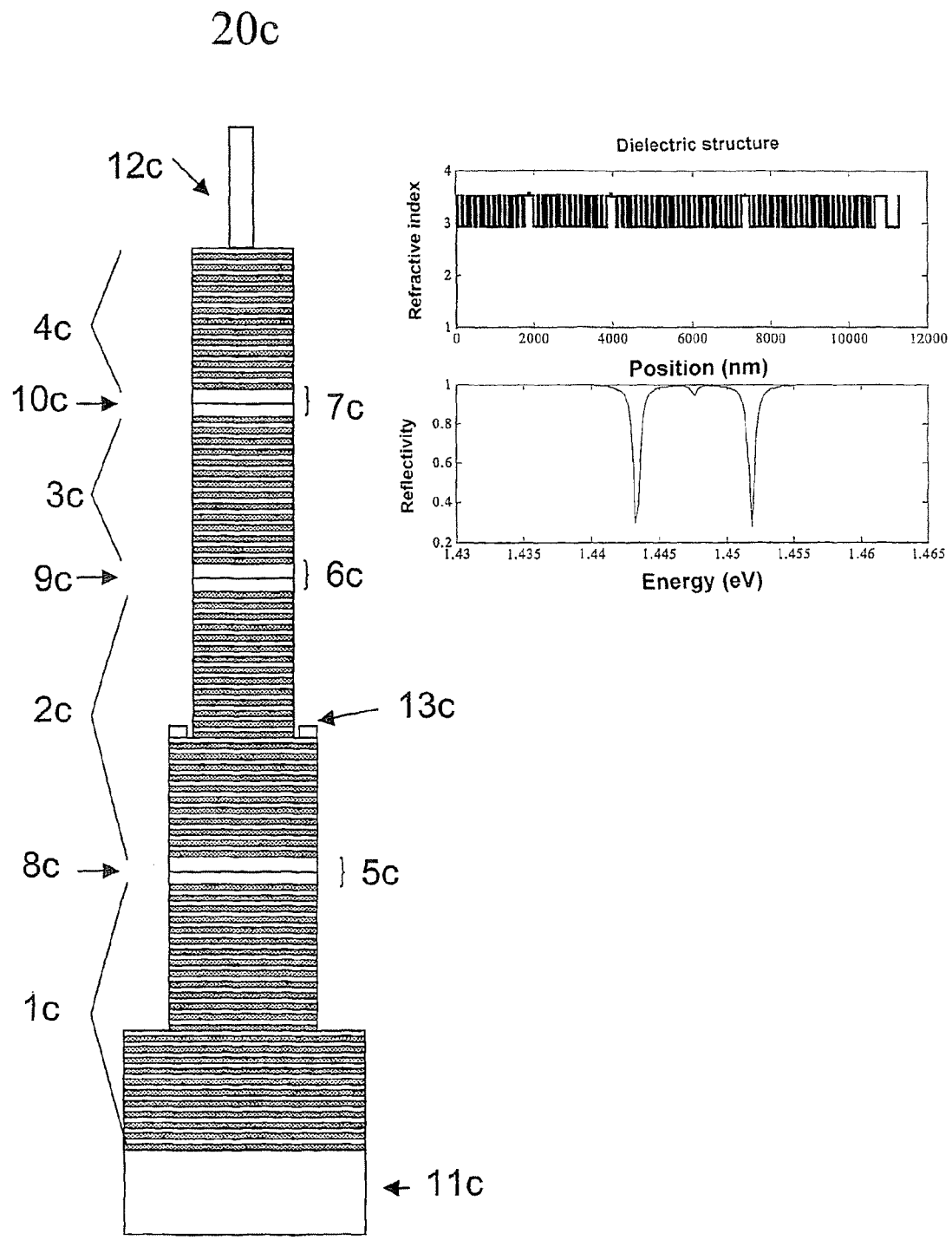
FIG. 9 illustrates a parametric conversion device wherein an electrically contacted injection means is built into the conversion system.

One embodiment for a device comprising an electrical injection means, noted 20c, is presented in FIG. 9. The cavities 6c and 7c are strongly coupled via the coupling mirror 3c, which comprising 13 pairs of AlAs/GaAs layers in the example presented. Said two strongly coupled cavities provide the resonances for the signal and idler. The third cavity, known as injection cavity, noted 5c, is weakly coupled to the two other cavities via the mirror 2c which comprises 23 pairs of layers in the example presented. The reflectivity spectrum calculated, corresponding to said structure, is presented on the right-hand part of FIG. 9. The low energy mode is the signal mode, the high energy mode the idler and the intermediate mode is the mode corresponding to the injection cavity 5c. The injection cavity is electrically contacted according to the means known by the person skilled in the art. For this purpose, the mirrors 2c and 1c are doped, then contacted electrically 13c. The device may be coupled to an optical fibre noted 12c for collecting the two parametric frequencies. The substrate here is noted 11c.

A plurality of uses of the device are possible. The device being able to operate in the parametric amplification regime, it may be used in the field of telecommunications for the regeneration of weak signals.

For the embodiment involving a non-linearity in $\chi^{(2)}$, the parametric generation enables frequencies approximately twice as weak as that of the pump to be obtained, in a spectral range that is difficult to access by conventional laser diodes.

The parametric generation of twin photons is the basis of cryptographic methods and serve as a substitute to using single photon sources. Within this framework, the photons emitted by the idler serve to trigger the detection of signal photons. Any interception of a photon by a third party is systematically detected. Moreover, the parametric generation offers an additional advantage in relation to single photon sources, i.e. the possibility of generating intricated states, such as those presented in FIG. 5. Various modes of quantum cryptography are described in the publication by N. Gisin, G. Ribordy, W. Tittel and H. Zbinden, "Quantum cryptographic", Rev. Mod. Phys., p 145 (2002).

The invention claimed is:

1. A monolithic system for the parametric conversion from a pump wave to a pump frequency, comprising
   at least two resonant cavities, said cavities being strongly coupled via at least one coupling mirror, wherein the coupling between said cavities lifts the degeneracy between the at least two resonant cavities, said cavities being arranged for generating parametric frequencies associated to said pump frequencies, at least one of said cavities comprising an active non-linear medium, said at least one coupling mirror being arranged such that said parametric frequencies are located in the stop band of said at least one mirror for an injection direction of said pump wave via the surface of said system.

2. The monolithic system of claim 1, wherein the at least two resonant cavities includes three resonant cavities, said cavities being strongly coupled via two coupling mirrors, wherein the coupling between said cavities lifts the degeneracy between the three resonant cavities, said cavities being arranged for generating three parametric frequencies associated to said pump frequency, said system comprising two mirrors which close the system and which form said cavities with said two coupling mirrors.

3. The monolithic system of claim 1, wherein the at least two resonant cavities includes two resonant cavities, said cavities being strongly coupled via a coupling mirror, wherein the coupling between said cavities lifts the degeneracy between the two resonant cavities, said cavities being arranged for generating three parametric frequencies associated to said pump frequencies, said system comprising two mirrors which close the system and which form said cavities with said coupling mirror.

4. The monolithic system of claim 1, wherein said active non-linear medium has an $\chi^{(3)}$ type susceptibility.

5. The monolithic system of claim 1, wherein said active non-linear medium has an $\chi^{(2)}$ type susceptibility.

6. The monolithic system of claim 1, wherein said active material is a quantum well, a quantum dot system, or a polymer.

7. The monolithic system of claim 1, wherein said at least one coupling mirror is a Bragg mirror.

8. The monolithic system of claim 1, wherein said at least one coupling mirror comprises a dielectric or metallic layer having the reflectivity parameters that are used for said parametric conversion.

9. The monolithic system of claim 1, wherein each of said cavities has a thickness substantially equal to a small integral number of times the semi-wavelength of the pump wave desired to be converted.

10. The monolithic system of claim 9, wherein the thickness of at least one cavity has a lateral gradient.

11. The monolithic system of claim 9, wherein the monolithic system is of vertical type and in that the thickness of the first cavity has a lateral gradient in the first direction, and the second cavity has a thickness having a lateral gradient in a second direction different from said first direction.

12. The monolithic system of claim 9, wherein the core of the cavities is epitaxied.

13. The monolithic system of claim 9, wherein at least one coupling mirror is epitaxied.

14. An optical device for producing parametric conversion from a pump wave to a pump frequency comprising
at least two resonant cavities, wherein the at least two resonant cavities includes three resonant cavities, said cavities being strongly coupled via at least one coupling mirror, wherein the coupling between said cavities lifts the degeneracy between the three resonant cavities, said cavities being arranged for generating parametric frequencies associated to said pump frequencies, at least one of said cavities comprising an active non-linear medium, said at least one coupling mirror being arranged such that said parametric frequencies are located in the stop band of said at least one mirror for an injection direction of said pump wave via the surface of said system; and
means for injecting the pump wave to a pump wavelength, said injection means being configured for injecting said pump wave substantially according to the axis of said system.

15. The optical device of claim 14, wherein said injection means is formed by a cavity rigidly connected to said system and weakly coupled to same via a weak coupling mirror for said pump wavelength.

16. A use of a device according to claim 14, for producing parametric conversions.

* * * * *